United States Patent
Zampardi et al.

(10) Patent No.: US 7,019,383 B2
(45) Date of Patent: Mar. 28, 2006

(54) GALLIUM ARSENIDE HBT HAVING INCREASED PERFORMANCE AND METHOD FOR ITS FABRICATION

(75) Inventors: Peter J. Zampardi, Newbury Park, CA (US); Kevin Choi, Thousand Oaks, CA (US); Lance G. Rushing, Oxnard, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/376,371

(22) Filed: Feb. 26, 2003

(65) Prior Publication Data

US 2004/0164319 A1    Aug. 26, 2004

(51) Int. Cl.
*H01L 27/082* (2006.01)
*H01L 21/331* (2006.01)

(52) U.S. Cl. .................. 257/592; 257/197; 257/198; 257/558; 257/583; 438/235; 438/309; 438/312; 438/350

(58) Field of Classification Search ........ 257/197–198, 257/200, 558, 567, 583, 592; 438/235, 309, 438/312, 350
See application file for complete search history.

(56) References Cited

U.S. PATENT DOCUMENTS

| | | | | |
|---|---|---|---|---|
| 5,177,583 A | * | 1/1993 | Endo et al. | 257/190 |
| 5,603,765 A | * | 2/1997 | Matloubian et al. | 117/94 |
| 6,563,145 B1 | * | 5/2003 | Chang et al. | 257/197 |
| 2002/0163014 A1 | * | 11/2002 | Welser et al. | 257/197 |

* cited by examiner

*Primary Examiner*—Donghee Kang
(74) *Attorney, Agent, or Firm*—Farjami & Farjami LLP

(57) ABSTRACT

According to one exemplary embodiment, a gallium arsenide heterojunction bipolar transistor comprises a collector layer and a first spacer layer situated over the collector layer, where the first spacer layer is a high-doped P+ layer. For example, the first spacer layer may comprise GaAs doped with carbon. The gallium arsenide heterojunction bipolar transistor further comprises a base layer situated over the first spacer layer. The base layer may comprise, for example, a concentration of indium, where the concentration of indium is linearly graded in the base layer. The base layer may comprise InGaAsN, for example. The gallium arsenide heterojunction bipolar transistor further comprises an emitter layer situated over the base layer. The emitter layer may comprise, for example, InGaP.

17 Claims, 4 Drawing Sheets

GALLIUM ARSENIDE HBT HAVING INCREASED PERFORMANCE AND METHOD FOR ITS FABRICATION

BACKGROUND OF THE INVENTION

1. Field of the Invention

The present invention is generally in the field of fabrication of semiconductor devices. More specifically, the invention is in the field of fabrication of bipolar transistors.

2. Related Art

Gallium arsenide ("GaAs") based devices are able to provide the power and amplification requirements of various applications, such as handset power amplifiers, with improved linearity and power efficiency. Of particular interest are GaAs heterojunction bipolar transistors ("HBT"), which exhibit high power density capability, making them suitable as low cost and high power amplifiers in handsets used in CDMA, TDMA and GSM wireless communications. However, handset power amplifiers are required to operate over a large temperature range of between approximately −30.0° C. and approximately 85.0° C. Additionally, handset power amplifiers are generally powered by a battery, which can vary in output voltage. As a result, handset power amplifiers are required to effectively operate with a supply voltage that may range between approximately 2.65 volts and approximately 5.0 volts. Thus, semiconductor manufacturers are challenged to provide GaAs HBTs that must operate effectively in the above temperature and voltage ranges in devices such as handset power amplifiers.

By way of background, as temperature decreases, the base-emitter turn-on or threshold voltage and band gap of a GaAs HBT increases. In a handset power amplifier comprising a GaAs HBT, the turn-on voltage of the GaAs HBT can be utilized to determine a reference current, which can be utilized to set the current in the handset power amplifier. As a result, as temperature decreases, the current flowing though the handset power amplifier decreases, which undesirably reduces the performance of the handset power amplifier.

In an attempt to reduce the turn-on or threshold voltage of the GaAs HBT to enable the GaAs HBT to operate more effectively under wider temperature and supply voltage ranges, some semiconductor manufacturers have added a small amount of nitrogen to the base of the GaAs HBT. As a result of adding nitrogen to the base, the band gap of the GaAs HBT is reduced, which reduces the turn-on voltage of the GaAs HBT. For example, by adding approximately 3.0 atomic percent of nitrogen to the base of the GaAs HBT, the band gap of the GaAs HBT can be reduced by approximately 100.0 millivolts. However, the nitrogen also undesirably reduces DC current gain of the GaAs HBT.

In order to counter the reduction in DC current gain caused by the nitrogen, some semiconductor manufacturers have attempted to add indium to appropriately alter the band structure of the base to increase DC current gain. However, when the base is carbon doped, which is desirable for HBTs, the addition of indium in the base causes carbon to be compensated out of the base. Consequently, the addition of indium undesirably reduces DC current gain and linearity of the carbon-doped GaAs HBT. As a result, the addition of indium undesirably degrades performance the carbon-doped GaAs HBT.

Thus, there is a need in the art for a GaAs HBT having increased gain, linearity, and performance.

SUMMARY OF THE INVENTION

The present invention is directed to gallium arsenide-HBT having increased performance and method for its fabrication. The present invention addresses and resolves the need in the art for a GaAs HBT having increased gain, linearity, and performance.

According to one exemplary embodiment, a gallium arsenide heterojunction bipolar transistor comprises a collector layer and a first spacer layer situated over the collector layer, where the first spacer layer is a high-doped P+ layer. For example, the first spacer layer may comprise GaAs doped with carbon having a concentration of approximately $7 \times 10^{19}$ atoms per $cm^3$. The first spacer layer may have a thickness of between approximately 50.0 Angstroms and approximately 100.0 Angstroms, for example.

According to this exemplary embodiment, the gallium arsenide heterojunction bipolar transistor further comprises a base layer situated over the first spacer layer. The base layer may comprise, for example, a concentration of indium, where the concentration of indium is linearly graded in the base layer. The concentration of indium may be between approximately 3.0 atomic percent and approximately 8.0 atomic percent, for example. The base layer may comprise InGaAsN, for example. The gallium arsenide heterojunction bipolar transistor further comprises an emitter layer situated over the base layer. The emitter layer may comprise, for example, InGaP. The gallium arsenide heterojunction bipolar transistor might further comprise a second spacer layer situated between the base layer and the emitter layer, where the second spacer layer comprises a P type dopant. In another embodiment, the present invention is a method that achieves the above-described gallium arsenide heterojunction bipolar transistor. Other features and advantages of the present invention will become more readily apparent to those of ordinary skill in the art after reviewing the following detailed description and accompanying drawings.

DETAILED DESCRIPTION OF THE INVENTION

The present invention is directed to gallium arsenide HBT having increased performance and method for its fabrication. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
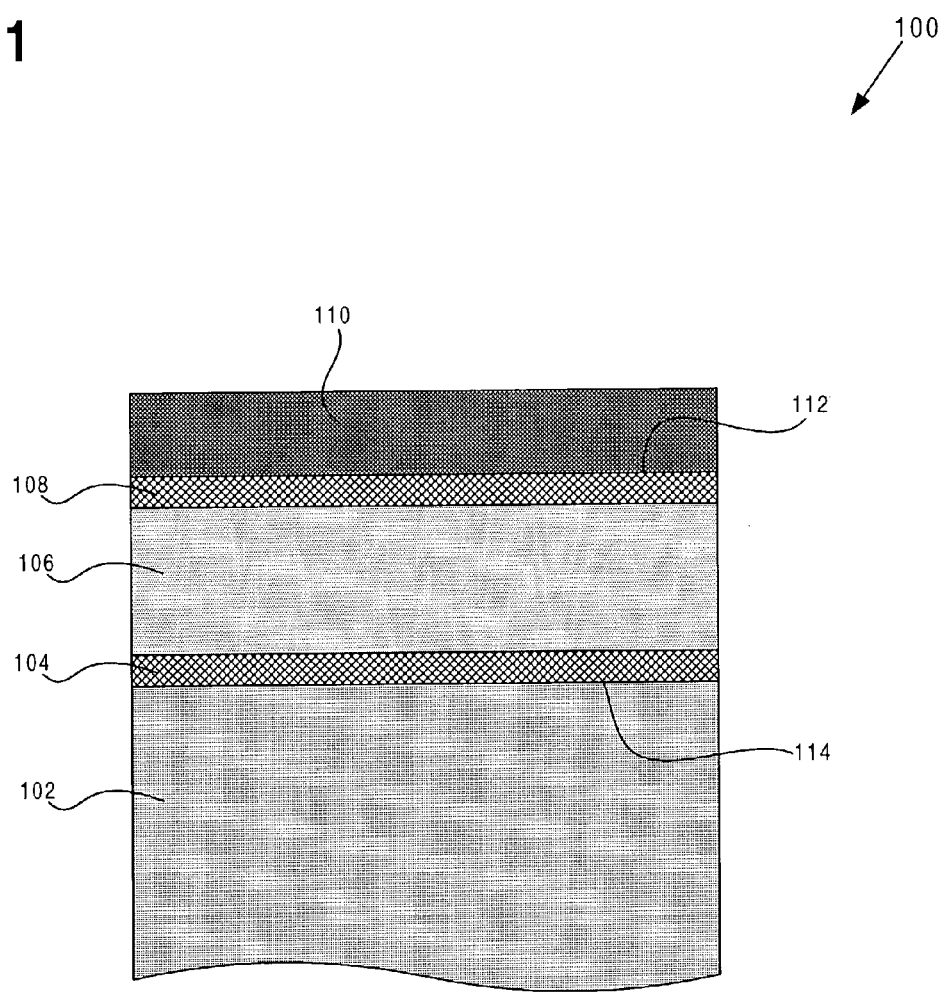
FIG. 1 illustrates a cross sectional view of an exemplary HBT fabricated in accordance with one embodiment of the present invention.

FIG. 1 shows a cross-sectional view of an exemplary HBT in accordance with one embodiment of the present invention. Certain details and features have been left out of FIG. 1, which are apparent to a person of ordinary skill in the art. Although HBT 100 illustrates an exemplary NPN GaAs HBT, the present invention may also apply to NPN or PNP HBTs comprising aluminum gallium arsenide, indium gallium phosphide, indium phosphide, indium gallium arsenide nitrogen, or other materials.

As shown in FIG. 1, HBT 100 comprises collector layer 102, spacer layer 104, base layer 106, spacer layer 108, and emitter layer 110. Collector layer 102 can be situated on a substrate (not shown in FIG. 1), such as a GaAs substrate. In the present embodiment, collector layer 102 is a low-doped N type layer that comprises GaAs, which can be doped with an N type dopant, such as silicon. It is noted that in other embodiments, instead of silicon, other N type dopants such as sulfur, selenium, or tellurium can be used. In fact, various references in the present application to the use of silicon as an N type dopant are meant to provide a brief and specific example of an N type dopant. However, in all instances, other possible N type dopants, such as sulfur, selenium, or tellurium can be used instead of silicon. In one embodiment, collector layer 102 can comprise a layer of GaAs doped with silicon at a concentration of approximately $1 \times 10^{16}$ atoms per $cm^3$. By way of example, collector layer 102 can have a thickness of between approximately 5000.0 Angstroms and 1.3 microns. Collector layer 102 can be formed by growing a layer of GaAs on a GaAs substrate (not shown in FIG. 1) using a metal organic chemical vapor deposition ("MOCVD") process or a "Molecular Beam Epitaxy" ("MBE") process or other processes.

Also shown in FIG. 1, spacer layer 104 is situated over collector layer 102. Spacer layer 104 is a high-doped P+ layer comprising GaAs, which can be doped with a P type dopant, such as carbon. For example, spacer layer 104 can comprise GaAs doped with carbon at a concentration of approximately $5 \times 10^{19}$ to $7 \times 10^{19}$ atoms per $cm^3$. By way of example, spacer layer 104 can have a thickness of between approximately 50.0 Angstroms and approximately 100.0 Angstroms. Spacer layer 104 can be formed by growing a layer of GaAs on collector layer 102 using a MOCVD process or a MBE process or other processes.

Further shown in FIG. 1, base layer 106 is situated over spacer region 104 and is a P type layer comprising GaAs, which can be doped with a P type dopant, such as carbon. For example, base layer 106 can comprise GaAs doped with carbon at a concentration level of approximately $4 \times 10^{19}$ atoms per $cm^3$. Base layer 106 can be formed by growing a layer of GaAs on spacer layer 104 using a MOCVD process or a MBE process or other processes. In the present embodiment, base layer 106 can also comprise indium, which can be linearly graded in base layer 106. For example, base layer 106 can comprise a concentration of between approximately 3.0 atomic percent and approximately 8.0 atomic percent of indium. For example, the concentration of indium may be linearly graded by linearly increasing the concentration of indium from 0.0 atomic percent of indium at interface 112, i.e. at the boundary of spacer layer 108 and emitter layer 110, to approximately 8.0 atomic percent of indium at interface 114, i.e. at the boundary of collector layer 102 and spacer layer 104. In the present embodiment, base layer 106 can comprise, for example, approximately 3.0 atomic percent of nitrogen, which causes a reduction in turn-on voltage of HBT 100. In one embodiment, base layer 106 can comprise Indium Gallium Arsenide Nitride ("InGaAsN").

Also shown in FIG. 1, spacer layer 108 is situated over base layer 106. Spacer layer 108 is a P type layer that comprises GaAs doped with a P type dopant, such as carbon. In one embodiment, spacer layer 108 can comprise GaAs doped with carbon at a concentration of approximately $7 \times 10^{19}$ atoms per $cm^3$. Spacer layer 108 can be formed by growing a layer of GaAs on base layer 106 using a MOCVD process or a MBE process or other processes. By way of example, spacer layer 108 can have a thickness of approximately 50.0 Angstroms.

Further shown in FIG. 1, emitter layer 110 is situated over spacer layer 108. Emitter layer 110 is an N type layer that comprises Indium Gallium Arsenide ("InGaAs"), which can be doped with an N type dopant, such as silicon at a concentration level of approximately $3 \times 10^{17}$ atoms per $cm^3$. Emitter layer 110 can be formed by using a MOCVD process or a MBE process or other processes. It is noted that N type emitter layer 110, P type base layer 106, and N type collector layer 102 make up the NPN components of exemplary HBT 100.

By utilizing a high-doped P+ spacer layer, i.e. spacer layer 104, situated between collector layer 102 and base layer 106, the present invention advantageously achieves an NPN GaAs HBT, i.e. HBT 100, having increased gain and linearity compared to a conventional GaAs HBT. Furthermore, by utilizing a base layer, i.e. base layer 106, comprising a graded concentration of indium, the present invention also achieves increased DC current gain. Additional, by utilizing a high-doped P+ spacer layer, i.e. spacer layer 104, the present invention advantageously achieves a GaAs HBT, i.e. HBT 100, that effectively utilizes nitrogen in base layer 106 to decreased turn-on voltage while avoiding an undesirable decrease in DC current gain which typically accompanies the use of nitrogen in conventional GaAs HBTs.

Figure 2:
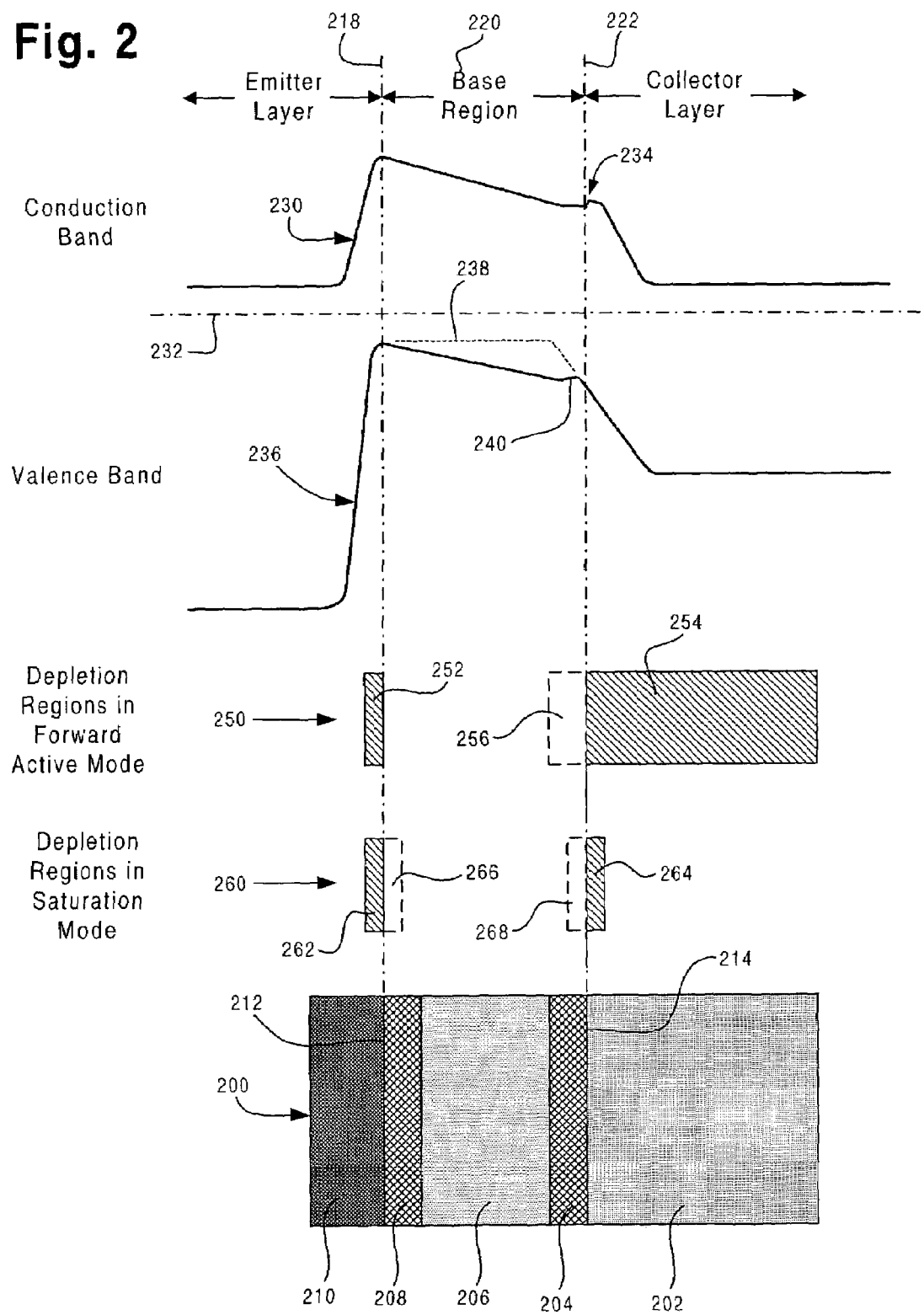
FIG. 2 illustrates an exemplary HBT, including exemplary conduction and valence band diagrams and exemplary depletion region diagrams, in accordance with one embodiment of the present invention.

FIG. 2 shows an exemplary HBT including exemplary conduction and valence band diagrams and exemplary depletion region diagrams for forward active and saturation HBT operating modes, in accordance with one embodiment of the present invention. In FIG. 2, HBT 200 corresponds to HBT 100 in FIG. 1. In particular, interfaces 212 and 214, emitter layer 210, spacer layer 208, base layer 206, spacer layer 204, and collector layer 202 in FIG. 2 correspond, respectively, to interfaces 112 and 114, emitter layer 110, spacer layer 108, base layer 106, spacer layer 104, and collector layer 102 in FIG. 1.

As shown in FIG. 2, emitter layer 210 is indicated by the area to the left of dashed line 218, base region 220 is indicated by the area between dashed lines 218 and 222, and collector layer 202 is indicated by the area to the right of dashed line 222. Base region 220 comprises spacer layer 208, base layer 206, and spacer layer 204. Thus, HBT 200 comprises emitter layer 210, base region 220, and collector layer 202. Also shown in FIG. 2, conduction band diagram 230 indicates the energy level of the conduction band in emitter layer 210, base region 220, and collector layer 202 of HBT 200 at thermal equilibrium relative to a "Fermi level," which is indicated by dashed line 232. By way of background, the Fermi level is a measure of the least tightly held electrons within a solid material, such as a semiconductor material.

Further shown in FIG. 2, notch 234 is situated at the transition from base region 220 to collector layer 202. Notch 234 is caused by indium reducing the doping level in base layer 206 by compensating carbon out of base layer 206. As discussed above, the concentration of indium linearly increases, i.e. ramps up, from a 0.0 concentration level at interface 212 to a concentration level of approximately 8.0 atomic percent of indium at interface 214. By way of background, indium is utilized to increase DC current gain to compensate for reduced DC current gain caused by the introduction of nitrogen in base layer 206. However, indium also causes carbon to be undesirably compensated out of base layer 206, which effectively lowers base doping and causes notch 234 to occur at the base-collector transition, i.e. the transition from base region 220 to collector layer 202.

Also shown in FIG. 2, valence band diagram 236 indicates the energy level of the valence band in emitter layer 210, base region 220, and collector layer 202 of HBT 200 at thermal equilibrium relative to the Fermi level discussed above, which is indicated by dashed line 232. Further shown in FIG. 2, ideal valence band diagram 238 extends above valence band diagram 236 between dashed lines 220 and 222. Ideal valence band diagram 238 indicates the energy level of the valence band that would result in HBT 200 if indium did not compensate carbon out of base 206 in HBT 200.

As a result of utilizing a high-doped P+ spacer layer, i.e. spacer layer 204, situated at the base-collector transition, the energy level of valence band diagram 236 at the base-collector transition is increased to energy level 240, which causes notch 234 to be reduced in size. In contrast, in a conventional GaAs HBT utilizing a low-doped P spacer layer situated between base and collector, the low-doped P spacer layer causes the energy level of valence band diagram 236 at the base-collector transition to decrease, which undesirably increases the size of notch 234, which can block current flow and decrease HBT performance. Thus, by decreasing the size of notch 234, the present invention advantageously achieves increase HBT performance compared to a conventional HBT utilizing a low-doped P spacer layer situated at the base-collector transition.

Further shown in FIG. 2, graph 250 shows depletion regions 252 and 254, which are formed when HBT 200 is operating in forward active mode, in which the base-emitter junction of HBT 200 is forward biased and the base-collector junction of HBT 200 is reverse biased. Depletion region 252 is situated in emitter layer 210 and depletion region 254 is situated in collector layer 202. Graph 250 also shows depletion region 256, which is formed in the forward active mode in base region 220 when a low-doped P spacer layer is situated between base layer 206 and collector layer 202. When a depletion region, such as depletion region 256, extends into base region 220, an undesirable "Early effect" can occur. By way of background, in a low-doped base, the edge of the depletion region on the collector side of the base will expand further into the base in response to increased collector/emitter voltage. As a result of the expansion of the depletion region into the base, base width decreases, which causes an increase in DC current gain as collector/emitter voltage is increased at constant base current. The Early effect refers to the increase in current gain as collector/emitter voltage is increased at constant base current discussed above, which is undesirable in a linear device, such as HBT 200. By utilizing a high-doped P+ spacer layer, i.e. spacer layer 204, at the base-collector transition, the present invention prevents the expansion of the depletion region in base region 220. As a result, the present invention achieves a base width that is substantially constant compared to the base width in a conventional GaAs HBT utilizing a low-doped P spacer layer. Thus, the present invention advantageously achieves a more predictable DC current gain, which results in increased linearity compared to the conventional GaAs HBT utilizing a low-doped P spacer layer.

Additionally, movement of the depletion region, such as depletion region 256, in base region 220 can uncover notch 234 in forward active operating mode, which can reduce DC current gain by block current flow. As a result, by utilizing a high-doped P+ spacer layer, i.e. spacer layer 204, to prevent the depletion region from expanding into base region 220, the present invention achieves increased DC current gain.

Further shown in FIG. 2, graph 260 shows depletion regions 262 and 264, which are formed when HBT 200 is operating in saturation mode, in which the base-emitter and base-collector junctions of HBT 200 are forward biased. Depletion regions 262 and 264 are situated in emitter layer 210 and collector layer 202, respectively. Graph 260 also shows depletion regions 266 and 268, which are formed in saturation mode in base region 220 when a low-doped P spacer layer is situated between base layer 206 and collector layer 202. In saturation mode in a conventional GaAs HBT comprising a low-doped P spacer layer, depletion region 268 can uncover a notch situated at the base-collector transition, such as notch 234, which can reduce DC current gain by blocking current flow. By utilizing a high-doped P+ spacer layer, i.e. spacer layer 204, at the base-collector transition, the present invention prevents the depletion region from expanding into base region 220 in the saturation operating mode. As a result, the present invention prevents notch 234 from blocking current flow in the saturation operating mode and, thereby, achieves increased DC current gain.

Figure 3:
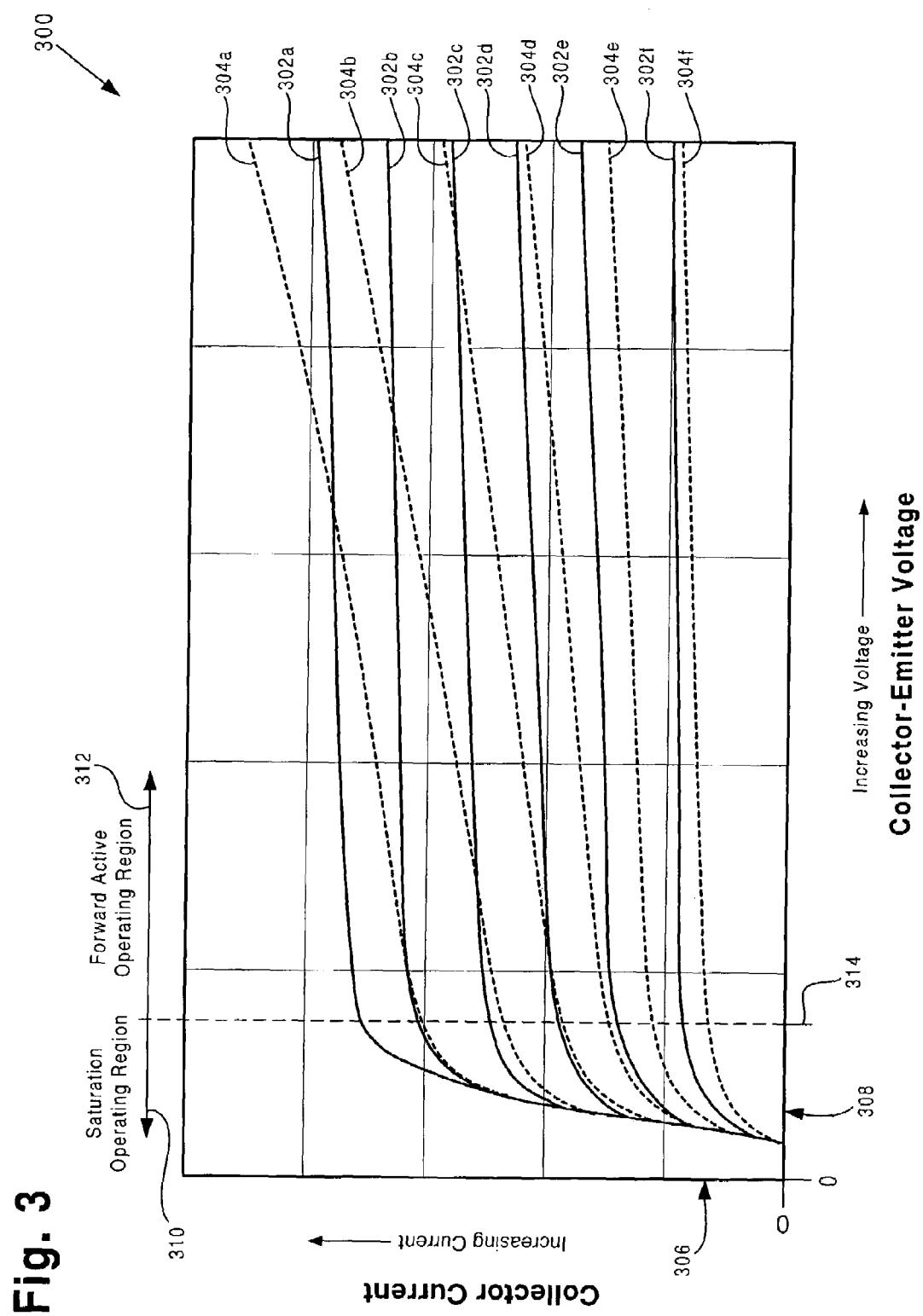
FIG. 3 is a graph comparing exemplary IV curves representing a conventional exemplary HBT and exemplary IV curves representing an exemplary HBT in accordance with one embodiment of the present invention.

FIG. 3 shows a graphical comparison of exemplary IV curves representing a conventional exemplary HBT having a low-doped P spacer layer and exemplary IV curves representing an exemplary HBT in accordance with one embodiment of the present invention. Graph 300 includes IV curves 302a through 302f, which show IV characteristics of HBT 200 having high-doped P+ spacer layer 204 in FIG. 2. Graph 300 also includes IV curves 304a through 304f, which show respective IV characteristics of a conventional HBT having a low-doped P spacer layer situated at the base-collector transition. Graph 300 further includes collector current axis 306 plotted against collector-emitter voltage axis 308.

As shown in graph 300 in FIG. 3, arrows 310 and 312 indicate saturation and forward active operating regions, respectively, of IV curves 302a through 302f and IV curves 304a through 304f. Also shown in graph 300, voltage 314 indicates the approximate transition from saturation operating region to forward active operating region and can be, for example, approximately 0.8 volts. It is noted that IV curves 302a through 302f and IV curves 304a through 304f are formed at constant base currents $I_{ba}$ through $I_{bf}$, respectively. Thus, IV curves 302a and 304a are formed at constant base current $I_{ba}$, IV curves 302b and 304b are formed at constant base current $I_{bb}$, etc.

In the saturation operating region of graph 300, IV curves 302a through 302f each indicate a higher collector current at constant base current compared to respective IV curves 304a through 304f. Thus, by forming a high-doped P+ spacer layer, i.e. spacer layer 204, at the base-collector transition, the present invention achieves an HBT having increased current gain in the saturation operating region compared to a conventional HBT utilizing a low-doped P spacer layer situated between base and collector, i.e. at the base-collector transition, of the HBT.

Additionally, in the forward active operating region of graph 300, IV curves 302a through 302f have a slope that is less than the slope of IV curves 304a through 304f, respectively. As a result, the present invention achieves an HBT having increased linearity in the forward active operating region compared to a conventional HBT utilizing a low-doped P spacer layer.

Figure 4:
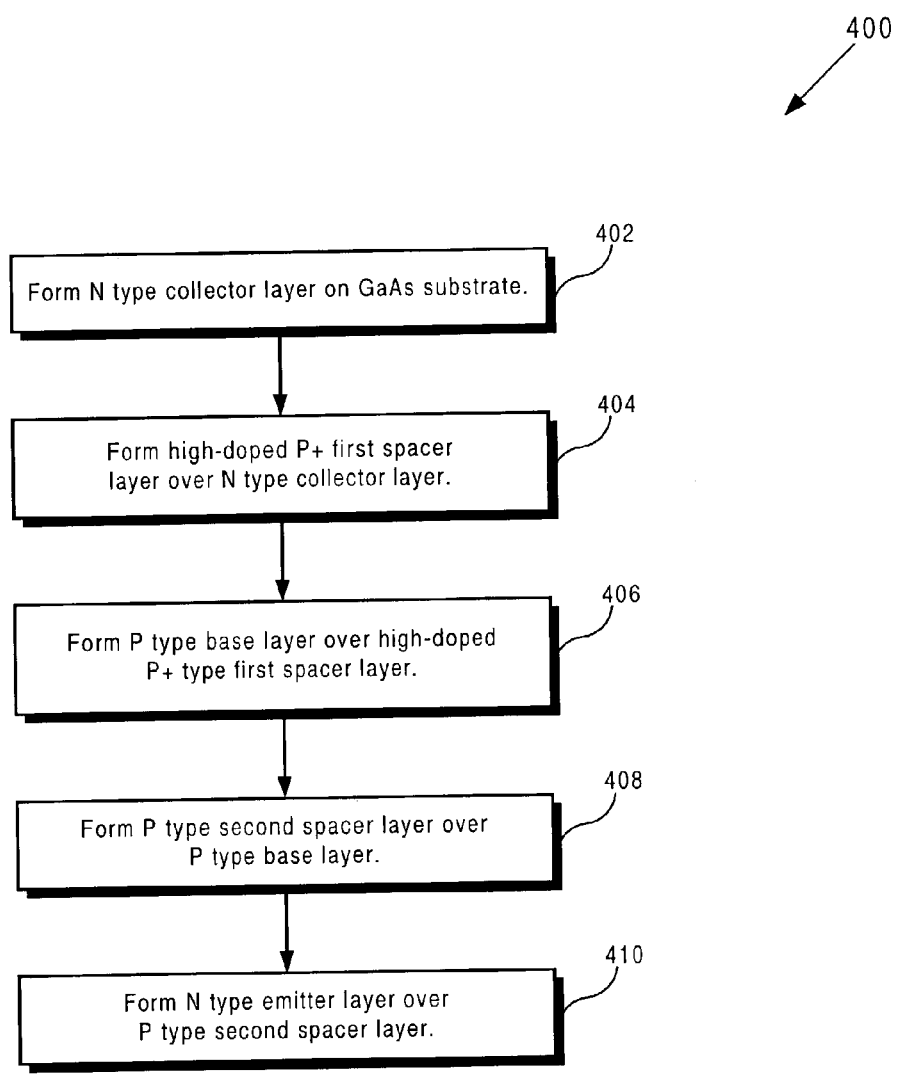
FIG. 4 shows a flowchart illustrating the steps taken to implement an embodiment of the present invention.

FIG. 4 shows a flowchart illustrating an exemplary method according to one embodiment of the present invention. Certain details and features have been left out of flowchart 400 that are apparent to a person of ordinary skill in the art. For example, a step may consist of one or more substeps or may involve specialized equipment or materials, as known in the art.

At step 402, collector layer 102 is formed on a GaAs substrate (not shown in any of the figures). For example, collector layer 102 can be formed by growing a layer of GaAs on a GaAs substrate (not shown in any of the figures) using a MOCVD process and appropriately doping the layer of GaAs with an N type dopant, such as silicon. At step 404, spacer layer 104 is formed over collector layer 102. For example, spacer layer 104 can be formed by growing a layer of GaAs on collector layer 102 using a MOCVD process and doping the layer of GaAs with a high concentration of a P type dopant, such as carbon. By way of example, the layer of GaAs can be doped with carbon at a concentration of approximately $7 \times 10^{19}$ atoms per $cm^3$.

At step 406, base layer 106 is formed over spacer layer 104. For example, base layer 106 can be formed by growing a layer of GaAs on spacer layer 104 using a MOCVD process and doping the layer of GaAs with a P type dopant, such as carbon. In the present embodiment, base layer 106 can comprise between approximately 5.0 atomic percent and approximately 8.0 atomic percent of indium. Base layer 106 can also comprise, for example, approximately 3.0 atomic percent of nitrogen. At step 408, spacer layer 108 is formed over base layer 106. Spacer layer 108 can be formed by, for example, growing a layer of GaAs on base layer 106 using a MOCVD process and doping the layer of GaAs with a P type dopant, such as carbon. In one embodiment, spacer layer 108 can be a high-doped P layer of GaAs doped with carbon at a concentration of approximately $7 \times 10^{19}$ atoms per $cm^3$.

At step 410, emitter layer 110 is formed over spacer layer 108 and can comprise indium gallium phosphide ("InGaP"). Emitter layer 110 can be formed by, for example, growing a layer of InGaP and doping the layer of InGaP with an N type dopant, such as silicon. By way of example, the layer of InGaAs can be doped with silicon at a concentration of approximately $3 \times 10^{17}$ atoms per $cm^3$.

As discussed above, by utilizing a high-doped P+ spacer layer, i.e. spacer layer 104, situated between base layer 106 and collector layer 102, the present invention achieves a GaAs HBT having increased gain and linearity in contrast to a conventional GaAs HBT comprising a low-doped P spacer layer. Thus, the present invention advantageously achieves a GaAs HBT having increased performance in contrast to a conventional HBT utilizing a low-doped P spacer layer. Furthermore, the present invention advantageously achieves a GaAs HBT that effectively utilizes nitrogen to decreased turn-on voltage while avoiding an undesirable decrease in DC current gain which typically accompanies the use of nitrogen in conventional GaAs HBTs.

It is appreciated by the above detailed description that the invention provides a GaAs HBT having increase gain, linearity, and performance. From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, gallium arsenide HBT having increased performance and method for its fabrication have been described.

The invention claimed is:

1. A gallium arsenide heterojunction bipolar transistor, said transistor comprising
    a collector layer;
    a first spacer layer situated over said collector layer, said first spacer layer being a high-doped P+ layer, said first spacer layer having a first concentration of a P type dopant;
    a base layer situated over said first spacer layer, said base layer having a second concentration of said P type dopant, wherein said base layer includes nitrogen for facilitating a decrease of a turn-on voltage, wherein said first spacer layer prevents said nitrogen from causing a decrease in a DC current gain of said transistor, wherein said base layer includes a concentration of indium that is linearly graded in said base layer, wherein said concentration of indium causes a decrease in an energy level of a conduction band to occur at a base-collector transition, wherein said first concentration of said P type dopant in said first spacer layer counteracts said decrease in said energy level of said conduction band at said base-collector transition;
    an emitter layer situated over said base layer;
    wherein said first concentration of said P type dopant is greater than said second concentration of said P type dopant, wherein said P type dopant comprises carbon.

2. The transistor of claim 1 wherein said first concentration of said P type dopant comprises approximately $7 \times 10^{19}$ atoms per $cm^3$ of said carbon.

3. The transistor of claim 1 wherein said first spacer layer has a thickness of between approximately 50.0 Angstroms and approximately 100.0 Angstroms.

4. The transistor of claim 1 further comprising a second spacer layer situated between said base layer and said emitter layer, said second spacer layer comprising said P type dopant.

5. The transistor of claim 1 wherein said base layer comprises InGaAsN.

6. The transistor of claim 1 wherein said concentration of indium is between approximately 3.0 atomic percent and approximately 8.0 atomic percent.

7. The transistor of claim 1 wherein said emitter layer comprises InGaP.

8. A method for fabricating a gallium arsenide heterojunction bipolar transistor, said method comprising steps of:
    depositing a first spacer layer on a collector layer, said first spacer layer being a high-doped P+ layer, said first spacer layer having a first concentration of a P type dopant;
    depositing a base layer on said first spacer layer, said base layer having a second concentration of said P type dopant, wherein said base layer includes nitrogen for facilitating a decrease of a turn-on voltage, wherein said first spacer layer prevents said nitrogen from causing a decrease in a DC current gain of said transistor, wherein said base layer includes a concentration of indium that is linearly graded in said base layer, wherein said concentration of indium causes a decrease in an energy level of a conduction band to occur at a base-collector transition, wherein said first concentration of said P type dopant in said first spacer layer counteracts said decrease in said energy level of said conduction band at said base-collector transition;

depositing an emitter layer on said base layer;

wherein said first concentration of said P type dopant is greater than said second concentration of said P type dopant, wherein said P type dopant comprises carbon.

9. The method of claim 8 wherein said first spacer layer has a thickness of between approximately 50.0 Angstroms and approximately 100.0 Angstroms.

10. The method of claim 8 further comprising a step of depositing a second spacer layer after said step of depositing said base layer.

11. The method of claim 8 wherein said base layer comprises InGaAsN.

12. The method of claim 8 wherein said concentration of indium is between approximately 3.0 atomic percent and approximately 8.0 atomic percent.

13. A gallium arsenide heterojunction bipolar transistor, said transistor comprising:

a collector layer;

a first spacer layer situated over said collector layer, said first spacer layer being a high-doped P+ layer, said first spacer layer having a first P type dopant concentration;

a base layer situated over said first spacer layer, said base layer having a second P type dopant concentration, wherein said base layer includes nitrogen for facilitating a decrease of a turn-on voltage, wherein said first spacer layer prevents said nitrogen from causing a decrease in a DC current gain of said transistor, wherein said base layer includes a concentration of indium that is linearly graded in said base layer, wherein said concentration of indium causes a decrease in an energy level of a conduction band to occur at a base-collector transition, wherein said first spacer layer counteracts said decrease in said energy level of said conduction band at said base-collector transition;

a second spacer layer situated over said base layer, said second spacer layer being doped with a P type dopant;

an emitter layer situated over said second spacer layer;

wherein said first P type dopant concentration is greater than said second P type dopant concentration.

14. The transistor of claim 13 wherein said first spacer layer comprises GaAs doped with carbon having a concentration of approximately $7 \times 10^{19}$ atoms per $cm^3$.

15. The transistor of claim 13 wherein said first spacer layer has a thickness of between approximately 50.0 Angstroms and 100.0 Angstroms.

16. The transistor of claim 13 wherein said base layer comprises InGaAsN.

17. A gallium arsenide heterojunction bipolar transistor, said transistor comprising:

a collector layer;

a first spacer layer situated over said collector layer, said first spacer layer being a high-doped P+ layer, said first spacer layer having a first P type dopant concentration;

a base layer situated over said first spacer layer, said base layer having a second P type dopant concentration;

an emitter layer situated over said base layer;

wherein said first P type dopant concentration is greater than said second P type dopant concentration;

a second spacer layer situated between said base layer and said emitter layer, said second spacer layer comprising a P type dopant.

* * * * *